United States Patent [19]
Bailey

[11] Patent Number: 5,654,640
[45] Date of Patent: *Aug. 5, 1997

[54] CELL TESTER DEVICE EMPLOYING A PRINTED TRANSPARENT ELECTRICALLY CONDUCTIVE ELECTRODE

[75] Inventor: John C. Bailey, Columbia Station, Ohio

[73] Assignee: Eveready Battery Company, St. Louis, Mo.

[*] Notice: The term of this patent shall not extend beyond the expiration date of Pat. No. 5,458,992.

[21] Appl. No.: 525,888

[22] Filed: Sep. 8, 1995

Related U.S. Application Data

[63] Continuation-in-part of Ser. No. 246,926, May 20, 1994, Pat. No. 5,458,992, which is a continuation of Ser. No. 648,080, Jan. 31, 1991, abandoned.

[51] Int. Cl.$^6$ .................... G01N 27/416; H01M 10/48
[52] U.S. Cl. .................... 324/435; 324/104; 429/93
[58] Field of Search ................ 324/435, 96, 104;
340/636; 429/90, 93; 359/265, 269, 270,
273; 345/87, 88, 98, 104

[56] References Cited

U.S. PATENT DOCUMENTS

| | | | |
|---|---|---|---|
| 1,497,388 | 6/1924 | Sterling | 324/435 |
| 3,968,639 | 7/1976 | Berets et al. | 359/267 X |
| 4,304,465 | 12/1981 | Diaz | 350/357 |
| 4,442,187 | 4/1984 | MacDiarmid et al. | 429/213 |
| 4,448,493 | 5/1984 | Matsudaira et al. | 350/357 |
| 4,680,527 | 7/1987 | Benenati et al. | 320/2 |
| 4,702,563 | 10/1987 | Parker | 350/351 |
| 4,702,564 | 10/1987 | Parker | 324/104 X |
| 4,723,656 | 2/1988 | Kiernan et al. | 429/93 X |
| 4,737,020 | 4/1988 | Parker | 350/351 |
| 4,835,475 | 5/1989 | Hanakura et al. | 324/435 |
| 4,835,476 | 5/1989 | Kurosawa | 324/435 |
| 4,902,108 | 2/1990 | Byker | 350/357 |
| 4,940,640 | 7/1990 | MacDiarmid | 429/213 |
| 5,015,544 | 5/1991 | Burroughs et al. | 429/93 |
| 5,059,895 | 10/1991 | Cataldi et al. | 324/435 X |
| 5,080,470 | 1/1992 | Warszawski | 359/269 |
| 5,156,931 | 10/1992 | Burroughs et al. | 429/93 |
| 5,196,144 | 3/1993 | Smith et al. | 252/500 |
| 5,223,003 | 6/1993 | Tucholski et al. | 29/623.4 |
| 5,231,356 | 7/1993 | Parker | 324/435 |
| 5,232,631 | 8/1993 | Cao et al. | 252/500 |
| 5,250,905 | 10/1993 | Kuo et al. | 324/435 |
| 5,332,530 | 7/1994 | Eid et al. | 252/583 |
| 5,339,024 | 8/1994 | Kuo et al. | 324/435 |
| 5,355,089 | 10/1994 | Tregger | 324/435 |
| 5,396,177 | 3/1995 | Kuo et al. | 324/435 |
| 5,413,739 | 5/1995 | Coleman | 359/265 X |
| 5,418,086 | 5/1995 | Bailey | 429/93 |
| 5,458,992 | 10/1995 | Bailey | 429/93 |
| 5,478,665 | 12/1995 | Burroughs et al. | 324/435 X |
| 5,491,420 | 2/1996 | Parker | 324/435 |

FOREIGN PATENT DOCUMENTS

| | | | |
|---|---|---|---|
| 450938 | 4/1991 | European Pat. Off. | |
| 497616 | 8/1992 | European Pat. Off. | 324/435 |
| 3150480 | 6/1983 | Germany | |
| 60-66170 | 4/1985 | Japan | |
| 5-95303 | 3/1993 | Japan | |
| 92/03852 | 3/1992 | WIPO | |
| 94/15246 | 7/1994 | WIPO | |

*Primary Examiner*—Vinh P. Nguyen
*Assistant Examiner*—Diep Do
*Attorney, Agent, or Firm*—Robert W. Welsh; Vivien Y. Tsang

[57] ABSTRACT

A cell tester device for use on an electrochemical cell which comprises a printed transparent electrically conductive electrode disposed on a plastic film, an ionically conductive electrochromic electrolyte printed on the electrode, and a conductive layer printed on the electrolyte.

20 Claims, 3 Drawing Sheets

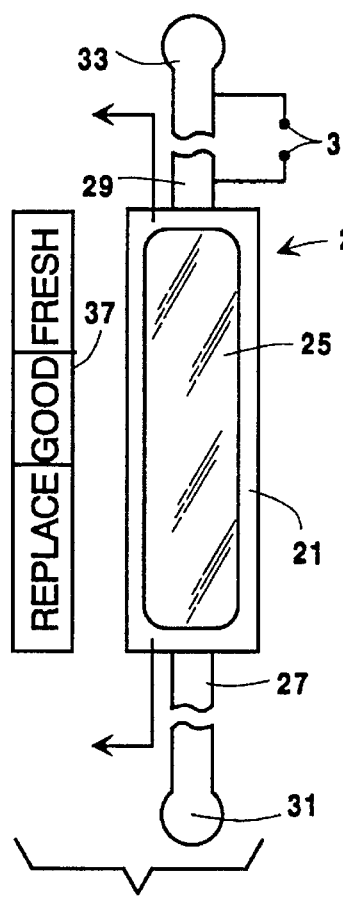
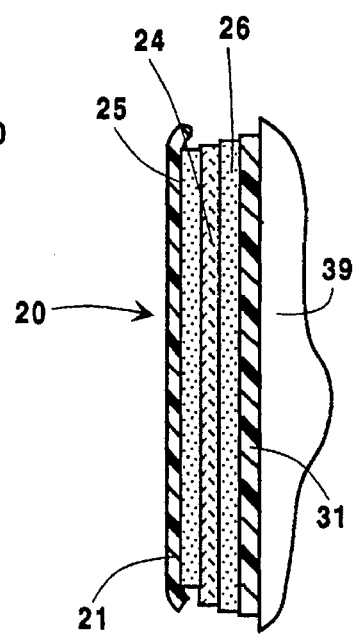
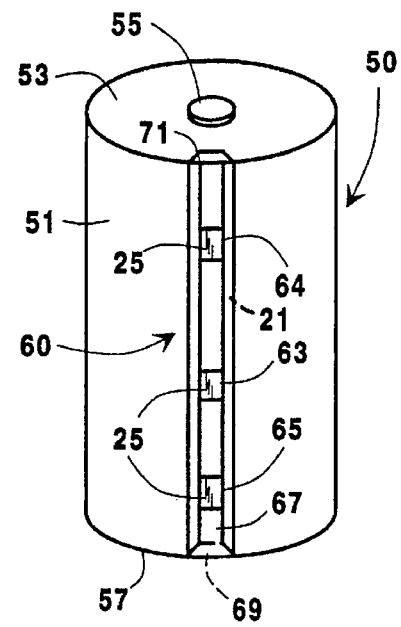
Fig. 1        Fig. 2        Fig. 3
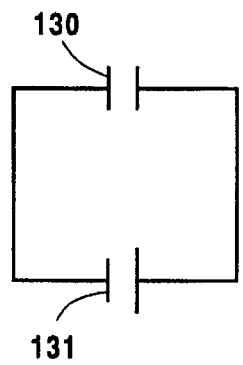
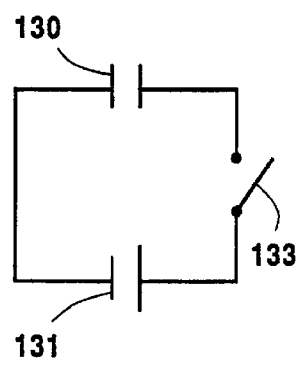
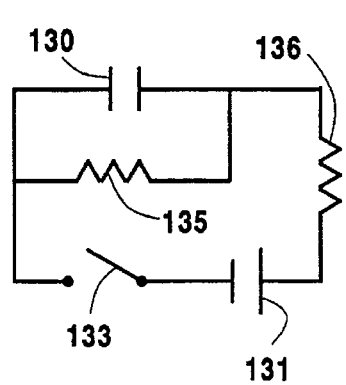
Fig. 4        Fig. 5        Fig. 6

CELL TESTER DEVICE EMPLOYING A PRINTED TRANSPARENT ELECTRICALLY CONDUCTIVE ELECTRODE

CROSS-REFERENCE TO RELATED APPLICATIONS

This application is a continuation in part of U.S. patent application Ser. No. 08/246,926 filed on May 20, 1994, now U.S. Pat. No. 5,458,992, which is a continuation of U.S. patent application Ser. No. 07/648,080 filed Jan. 31, 1991, now abandoned.

FIELD OF THE INVENTION

The invention relates to a cell tester device for use on an electrochemical cell which comprises a printed transparent electrically conductive electrode, such as indium-tin oxide with conductive means, suitable for making electrical contact with a first terminal of the cell; a printed ionically conductive electrolyte layer containing the electrochromic material disposed in contact with the transparent electrically conductive electrode; and a printed conductive layer disposed over the electrolyte layer containing the electrochromic material which serves as the counter electrode and is adapted to make contact with a second terminal of the cell whereupon the electrochromic electrode will change its appearance upon the application of a power source between the first and second terminals of the cell tester device.

BACKGROUND OF THE INVENTION

Batteries are generally stored for various periods of time before being put into use. The batteries can be stored by the seller and frequently when purchased they are again stored by the buyer prior to being put to use. It is therefore desired to have a simple testing means for determining if a battery has sufficient charge to operate a desired device. Initially, separate battery testers were developed which could measure the strength remaining in the battery. Recently battery testers have been developed that either are included in the battery package or assembled in the label secured to the battery. The testers generally indicate the capacity remaining in the battery.

U.S. Pat. No. 4,702,564 discloses a device for testing a battery, particularly a small, portable battery, comprising a flexible, transparent substrate on which is deposited a narrow band of a black light absorbing material. A conductive material, which may taper outwardly in opposite directions from a central point to a pair of terminals, is then deposited atop the substrate on the same side of the substrate as the absorber layer or on the opposite side of the substrate as the absorber layer. A layer of a cholesteric liquid crystal material is then deposited on the substrate on the opposite side from the black absorber layer or over the absorber layer. The conductive material is an epoxy cement-based conductor, preferably silver, printed or painted directly on the substrate. An indicator scale is located along sections of the conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly. The tester also includes means for determining the amp-hours or life of a battery.

U.S. Pat. No. 5,015,544 discloses a battery strength indicating and switch means on a battery which is coupled across the terminals of the battery and which is provided with an indicating means to indicate the strength of the battery and in addition, the battery strength indicating means is also provided with an in-line switch which can easily be depressed to complete the circuit so as to place the indicator means across the terminals of the cell and display the charge of the battery.

U.S. Pat. No. 5,059,895 discloses a battery voltmeter comprising:

(A) a dielectric layer;
(B) a conductive layer above or below one of the surfaces of the dielectric layer; and
(C) a temperature sensitive color indicator layer in thermal contact with the conductive layer, characterized in that the conductive layer has (1) thermal insulating means under one of its surfaces and (ii) sufficient heat generating capacity to affect a change in the temperature sensitive color indicator layer. The voltmeter can be integrated into a label and attached directly to a battery.

U.S. Pat. No. 4,835,475 discloses an apparatus for indicating the electromotive force of a dry battery which comprises:

(i) a film base;
(ii) an electrically conductive layer disposed on one side of the film base,
(iii) a protective layer disposed on the electrically conductive layer, and
(iv) a thermochromic layer disposed on the other side of the film base.

U.S. Pat. No. 4,442,187 discloses batteries having conjugated polymer electrodes in which the conjugated polymers are doped with ionic dopant species to a preselected room temperature electrical conductivity ranging from that characteristic of semiconductor behavior to that characteristic of metallic behavior, by means of reversible electrochemical doping procedures. The electrochemical doping reactions and their reverse electrochemical undoping reactions are utilized as the charging and discharging mechanisms of lightweight secondary batteries which employ doped or dopable conjugated polymer as one or both of their electrodes.

U.S. Pat. No. 4,940,640 discloses polyaniline electrodes in which the oxidation and hydrogenation levels of the polyaniline species of the electrodes are carefully controlled. Electrochemical cells employing these electrodes function by reversible oxidation and reduction of the polyaniline species forming the electrode.

U.S. Pat. No. 5,232,631 discloses solutions and plasticized compositions of electrically conductive substituted and unsubstituted polyanilines in nonpolar organic fluid phases with functionalized protonic acids and the use of such compositions for various applications such as conductive articles.

European Patent Application 497616-A2 discloses a tester for use in determining the voltage and state-of-charge of a battery. The tester can be permanently mounted on the battery and employs an electrochromic cell which changes visual appearance, for example, color or intensity of color when electrically connected across the terminals of a battery. The electrochromic cell undergoes an oxidation/reduction reaction on direct application of the DC potential of the battery. The color of the electrochromic cell can be compared with a color comparison chart to determine the condition of the battery. The tester can be permanently electrically connected to the battery or, preferably, can be connected momentarily to determine the state of the battery.

U.S. Pat. No. 5,080,470 discloses a process for manufacturing a light modulating device employing an elementary light-modulating cell comprising a first transparent electrode, also called the working electrode; a second electrode or counter-electrode (which may be transparent or non-transparent, depending on whether the picture element is observed by direct transmission of light or by reflection); an ionic conductor or electrolytic material placed between the electrodes; means of electro-chromism; means of electrical connection to an external source of electrical voltage enabling the cell to be controlled; and means of addressing (direct, multiplexed, and so forth) enabling its selective control (present if an elementary cell is part of a multiplicity of elementary cells in one same display device). The ionic conductor or electrolyte could comprise a water soluble salt or a water-soluble mixture of salts of at least one metal which can be cathodically deposited from an aqueous solution of one of its simple or complex ions; at least one initially water-soluble film-forming polymer resin, preferably in the proportion of one part by weight to 0.05 to 50 parts of anhydrous salts; and water.

An object of the present invention is to provide a cell tester device employing a printed transparent electrically conductive electrode, such as indium-tin oxide electrode with conductive means, disposed in contact with an ionically conductive electrolyte containing at least one electrochromic material which in turn is disposed in contact with a conductive layer.

Another object of this present invention is to provide a cell tester device that utilizes, in addition to a printed indium-tin oxide electrode, a printed electrolyte containing electrochromic material and a conductive layer (counter electrode).

These and other objects will be apparent from the following description.

SUMMARY OF THE INVENTION

The invention relates to a cell tester device for an electrochemical cell having a first terminal and a second terminal of opposite polarity in which the cell tester device comprises a translucent plastic layer; a transparent electrically conductive electrode, such as an indium-tin oxide electrode, printed on the plastic layer and the transparent electrically conductive electrode is adapted to make electrical contact with the first terminal of the cell; an ionically conductive electrolyte layer disposed on the transparent electrically conductive electrode and said electrolyte containing at least one electrochromic material that undergoes a visible change in color as the result of a chemical reaction in response to an applied potential voltage; and a conductive layer disposed over the electrolyte and adapted to make contact with the second terminal of the cell so that when the conductive means of the transparent electrically conductive electrode makes electrical contact with the first terminal of the cell and the conductive layer makes electrical contact with the second terminal of the cell, the electrochromic material will undergo a visible change that can be seen through the transparent electrically conductive electrode.

As used herein, the electrolyte containing the electrochromic material could comprise a separate solid electrochromic electrode and separate electrolyte layer.

As used herein a change in visual appearance shall mean a change in color or intensity of color. Preferably the electrolyte containing the electrochromic material should be an ink that can be printed on an indium-tin oxide electrode. As also used in this invention, the transparent electrodes can be hazy or translucent, preferably a thin layer, that allow observation of changes in the color of the electrochromic material.

In a preferred embodiment of the invention, the electrolyte ink could be deposited or printed into or upon the pores of the printed indium-tin oxide electrode. In the use of this type of printed electrode composite containing sufficient electrolyte in the pores of the composite, the metal ions will be reduced and cause the ions to change in visual appearance when a suitable voltage is applied across the electrode and conductive layer. This could increase the rate of change in the visual appearance of the electrolyte ink as viewed through the indium-tin oxide electrode.

Although indium-tin oxide powder could be the conductive means for the printed indium-tin oxide electrode, other electrically conductive particulate materials could be used such as melt- or solution-processable electrically conductive polymers, such as those described in U.S. Pat. No. 5,232,631, e.g., modified substituted or unsubstituted polyanilines or the thermal decomposition products of metal-organic components.

There are three general categories of materials which are suitable to produce transparent conductive coatings. These are (1) inks formulated with transparent conductive particles (powders) plus binders and solvents which produce a transparent conductive film when printed and cured, (2) solutions of suitable precursors which produce conductive transparent films (usually mixed metal oxide films) upon thermal decomposition and (3) solutions of conductive polymers which can be printed and dried to form suitable transparent conductive films. The following are examples of each of these categories.

1. Conductive Particulate Materials
   a. Polymers polyaniline, polypyrole, polythiophene
   b. Binary Metal Oxides tin oxide, indium oxide, zinc oxide
   c. Doped Metal Oxides indium oxide doped with tin, fluorine, antimony, lead or phosphorus zinc oxide doped with aluminum or indium
2. Precursor Materials for Thermal Decomposition
   a. Metal Oxide Precursors
      i. Indium doped tin oxide produced by decomposition of In isopropylate and Sn butyrate; >400° C
      ii. Doped indium and tin oxides produced by decomposition of Sn/In/Sb alkoxides: <50° C.
      iii. Cadmium Stannate produced by thermal decomposition of Cd/Sn alcoholic solutions at 650° C.
3. Solution Processable (soluble) Conductive Polymers
   a. Surfactant Doped Polyaniline, U.S. Pat. No. 5,196,144
   b. Polyacid doped polyaniline, polythiophene, polypyrole and poly(p-phenylene sulfide)

Indium oxide can be doped with 2 to 10% tin oxide that improve its electrical conductivity. Although these indium-tin oxide materials can be sputtered onto glass and glass substrates, they will not bond to plastic film as well as to glass because the coating process could raise the temperature of the plastic sufficient to shrink or melt the plastic film. In addition, a coated indium-tin oxide layer on a plastic film is generally subject to mechanical damage when the film is flexed. Contrary to the use of sputtered techniques, it was found that printing techniques do not generate a large amount of heat and therefore indium-tin oxide inks can be printed on a plastic film of choice and only in the location required. The thickness of a dried indium-tin oxide printed layer for in this invention can very between 0.1 to 20 microns, preferably between 2 to 6 microns and more preferably between 3 to 5 microns.

Possible variations in the indium-tin oxide ink composition of this invention include the following:

1. Solids content can be varied according to the viscosity desired in the ink for printing and/or the desired thickness and conductivity of the cured coating. The resistivity of a cured coating should be of the order of between 10 ohms to 5K-ohm/sq., preferably between 200-ohms/sq. and 3K-ohm/sq. for best electrochrome tester device operation.

2. Conductive powder itself can be doped substoichiometric oxides such as oxide doped with Sn, F, Sb, Pb, P and mixtures thereof, Zn-oxide doped with Al and/or In, or indium-tin oxide (ITO). Some examples of the oxides are F-doped tin oxide (F—$SnO_2$), Sb-doped tin oxide (Sb—$SnO_2$) or Al-doped zinc oxide (Al—ZnO).

3. Physical form of the conductive powder can be spherical or acicular (tree or needle like) particles or mixtures thereof. Use of the acicular particles should provide better conductivity because of the better interparticle contact; possibly a lower amount could be used to obtain the same conductivity as that with the spherical particles.

4. Particle size of the conductive powder should be in a range which will provide a smooth, uniform coating, e.g., the spherical powder that could be used can be between 0.01 to 5.0 microns and preferably about 0.03 micron in diameter.

5. Temperature for drying the ink is preferably 20° F. but could be less than 140° F. (60° C.) to prevent shrinkage of a plastic substrate. A solvent or solvent mixture for the ink can be selected according to vapor pressure to provide the desired drying temperature and time.

6. Suitable binders are polyester, the polyvinyl butyral (PVB) resin used by American Ink and Coatings and the polyester resin used by Acheson. The PVB binder can be used to form a composition containing, for example, 10 parts by weight acicular ITO, 40 parts spherical ITO, 3 parts PVB resin, 37.6 parts ethyl alcohol and 9.4 parts n-propyl acetate, and this composition will have a moderate drying temperature.

The cell testing device is provided for detecting and measuring the state-of-charge of a cell or battery. In one embodiment, the test device employs an electrolyte that changes visual appearance as the metal ions are reduced in the electrolyte under the influence of a direct current potential applied from the battery directly across the indium-tin oxide printed electrode and the conductive layer (counter electrode).

In the preferred embodiment of the invention, the tester is incorporated into a label for a battery. In this embodiment, the tester is comprised of a transparent indium-tin oxide printed electrode disposed over a printed electrolyte which is disposed over a printed conductive layer. A printed layer of ionically conductive electrolyte material containing the electrochromic material is disposed between these components.

In one embodiment, the electrolyte ink could comprise a solution of at least one salt of at least one cathodically depositable metal with a polymeric binder.

In one of the preferred embodiments of the invention, the electrolyte would be aqueous electrolyte ink of the type taught in their U.S. Pat. No. 5,080,470 which contains a binder such as hydroxyethyl cellulose, hydroxyropyl cellulose, polyvinylalcohol or PEO; a $TiO_2$ pigment, and a bismuth, copper or bromine salt or combinations of salts. These aqueous electrolyte inks require time to dry and generally require heaters to speed up the drying time. However, heaters could cause the drying of the printed ink to shrink the plastic film on which the ink is deposited.

It was found that the drying time can be reduced by using an organic solvent-based ink. This can be accomplished by choosing a polymeric binder which is soluble in both an organic solvent and in water, for example, polyvinyl alcohol hydroxypropyl cellulose or polyethylene oxide.

An ink can be first prepared in water to dissolve the electrolyte salts and the aqueous electrolyte can be then dried to produce a powder in which the salts are well dispersed in the polymer and ink pigment. The powder is then re-wet with a non-aqueous solvent which dissolves the polymer binder. This ink with the more volatile solvent dries more quickly than a similar aqueous formulation. Once the ink is dried, it will absorb moisture from the air and function as an aqueous electrolyte. The step of dissolving the salts in water may not be required if the salts can be adequately dispersed as small particle solids. In this case, the ink can be formulated by dry blending all of the solids except the polymer and then combining the powder with a non-aqueous solution of the polymer. The electrolyte ink can be printed over the printed indium-tin oxide electrode at a thickness of between 1 micron and 200 microns, preferably between 5 microns and 100 microns and more preferably between 20 microns and 50 microns.

The cathodically depositable metal can be a single metal or several metals chosen from most of the metals that can be deposited alone or cojointly deposited with one or more additional metals. A requirement of the metal is that its ion be a cathodically reducible metal ion and that the deposition of the metal ion produces a visual appearance change. Preferably, the metal should be self-erasing so that once the power source is removed, the material returns to its original state (i.e., is reoxidized). Suitable metals are zinc, cadmium, lead, silver, copper, iron, cobalt, nickel, tin, indium, platinum, palladium, gold, bismuth, antimony, tellurium, manganese, thallium, selenium, gallium, chromium, tungsten and molybdenum. Generally the metals should be associated with any of a large number of water soluble film forming polymer resins. The actual crystalline structure of the developed metallic deposit, which appears interspersed in a network of a polymer resin, could be that of a highly divided state with regard to appearance and optical density. The electrolyte can contain, in addition to the already mentioned electro-depositable cations, cations of metals which cannot be electro-deposited from an aqueous solution in substantial proportions. This characteristic produces a greater flexibility in the formulation of electrolytic materials that can respond to various individual applications requirements. The preferred metals for use in this invention are bismuth, zinc, lead, copper, silver and mixtures thereof. Preferably, the metallic deposit formed at the interface region should be capable of being redissolved by anodic oxidation, without a residual deposit remaining.

The metallic salts for use in this invention are ionic compounds in which the metal is present in cationic form or incorporated in a cationic complex; the anions of these compounds, and other conditions (particularly the pH), are chosen such that the compounds are substantially completely soluble in an aqueous medium. Appropriate anions could be found, for example, among the following: chloride, nitrate, sulphate, borate, fluoride, iodide, bromide, fluoroborate, fluorosilicate, fluorogallate, dihydrogen phosphate, chlorate, perchlorate, bromate, selenate, thiosulfate, thiocyanate, formate, acetate, butyrate, hexanoate, adipate, citrate, lactate, oleate, oxalate, propionate, salicylate, glycinate, glycocollate, glycerophosphate, tartrate, acetyl-acetonate, isopropylate, benzoate, malate, benzene sulphonate, and 1-phenol-4-sulphonate, in particular. The preferred anions can be found in the group chloride, bromide, acetate and nitrate.

Usable initially water-soluble film-forming polymer resins comprise resins capable of forming an ink component. Suitable resins are polymers such as polypropylene oxide, polyethylene oxide, polyoxyethylene, polyvinylpyrrolidone, polyvinyl alcohol, the cellulosic ethers such as, for example, hydroxyethylcellulose and carboxymethyl cellulose, sodium alginate, polyacrylic acid and its derivatives, gelatin, gum arabic, polystyrene sulfonic acid, polyacrylamide, and in particular several resins which are compatible with each other (that is, which are not coprecipitant) which can be used in a mixture. The polymer resin provides the material or fluid formative ink composition with a viscosity which facilitates application in one or more thin layers, a viscosity which can be adjusted in various conventional ways.

The transparent or translucent electrically conductive electrode can be made of indium-tin oxide with a suitable binder or resin so that the electrode could be deposited as an ink on a substrate such as a transparent plastic sheet. Salts used in a $H_2O$/ETOH solution can be used in nonaqueous solutions with a non-$H_2O$ solvent binder. The conductive layer could be selected from the group consisting of copper, carbon, silver, nickel, titanium and electrically conductive polymers. Again, the conductive layer could be preferably printed over the printed electrolyte ink. The thickness of this printed conductive layer can be between 2 microns and 200 microns, preferably between 4 microns and 100 microns, and most preferably between 15 microns and 50 microns. The thickness of the printed transparent electrically conductive material should be between 0.1 and 20 microns. The thickness of the printed electrolyte should be between 1 to 200 microns.

It is preferred that the electrolyte ink be applied by a high speed printing process and contain a pigment such as titanium dioxide to provide a white contrast, substituted titanium dioxides to produce various shades of yellow, and other inorganic or organic pigments. Preferably, the contrast agent is not conductive and is used only in the electrolyte ink.

The transparent electrically conductive electrode, the conductive layer and electrolyte could be printed on a plastic film in the appropriate order. The thickness of the cell tester device could vary from 20 to 800 microns, and preferably from 100 to 200 microns.

Suitable translucent or transparent plastic films for use as the substrate of this invention are polyesters, polyvinyl chloride (PVC), polyethylene, polyvinylidene chloride and polycarbonates with PVC being the preferred material.

A preferred embodiment of the invention would be a tester device comprising an electrically conductive indium-tin oxide printed electrode composite containing electrically conductive particles of indium-tin oxide (ITO); an electrically conductive layer of carbon; and an ionically conductive electrolyte ink composed of hydroxyethyl cellulose, $CuCl_2$, $BiCl_3$, LiBr and pigment (e.g. $TiO_2$ is a white pigment). The components are assembled as discussed above. The printed electrolyte ink would contain the cathodically reducible metal ion $Bi^{+++}$ along with the counter electrode couple $Br^-$. When power is applied across the device, the metal ion is reduced forming a black metallic Bi deposit against the white pigment of the $TiO_2$ in the electrolyte gel. This will produce a visual appearance change in the electrolyte gel due to the deposit of Bi which can be seen through the working electrode. The electrochemical reactions are believed to be as follows:

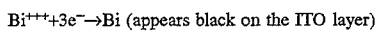

$Bi^{+++} + 3e^- \rightarrow Bi$ (appears black on the ITO layer)

$2Br^- \rightarrow Br_2 + 2e^-$ (hidden behind $TiO_2$ pigment)

The Bi will be deposited at the interface of the printed indium-tin oxide electrode and the printed electrolyte ink while the $Br_2$ will be deposited at the interface of the conductive layer and the printed electrolyte layer. Thus the printed electrolyte ink serves as an electrochromic material, the electrolyte and the counter electrode system thereby making the device cost effective to produce.

BRIEF DESCRIPTION OF THE DRAWINGS

FIG. 1 is a schematic elevational view of the cell tester device of the present invention accompanied by a scale for comparing the color of the indicating device and determining the state of charge of the cell;

FIG. 2 is a sectional view taken along the line shown in FIG. 1;

FIG. 3 is a perspective view of a battery having the cell tester label mounted on a housing;

FIG. 4 is a simplified schematic of the cell tester label device connected for an open circuit test of a battery.

FIG. 5 shows the simplified schematic of FIG. 4 with a switch added to isolate the cell tester label device from the cell;

FIG. 6 is a simplified schematic of a closed circuit cell tester label device;

DETAILED DESCRIPTION OF THE PREFERRED EMBODIMENTS

Figure 7:
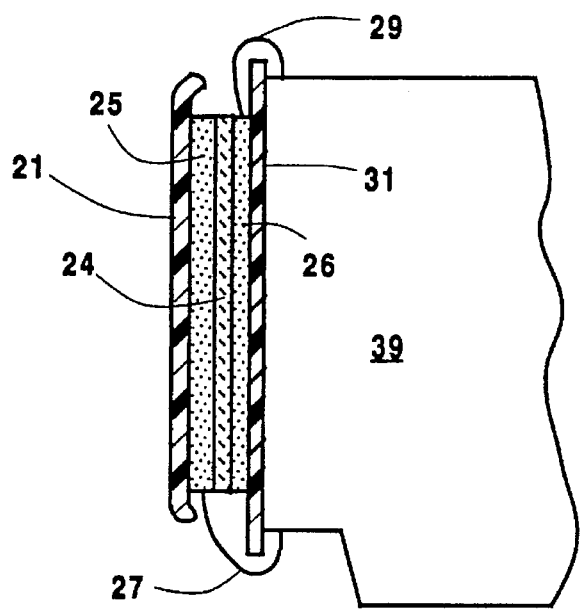
FIG. 7 is a partial sectional view showing a cell tester label applied to a battery.

Referring to FIG. 1 and FIG. 2, a typical electrochromic cell tester label of this invention is shown and indicated generally by the number 20. The label has a transparent or translucent cover 21 for containing the several components of the cell tester. The translucent or transparent plastic layer 21 is placed over electronically conductive transparent printed electrode 25. Electrical conductors 27 and 29 extend from each end of the cell tester 20 in which conductor 27 is shown as being of indeterminate length and has a terminal 31 for connection to an external terminal of a battery with its opposite end connected to the printed conductive electrode 25 of cell tester 20. Likewise, the conductor 29 is shown of indeterminate length and has a terminal 33 for connection to the opposite terminal of the battery to be measured and its opposite end is connected to the conductive layer 26 of cell tester 20. A switch is schematically illustrated at 35 which can be used to connect the cell tester 20 across the terminals of a battery being tested. A color scale 37 can be mounted on the housing of the cell tester 20 for providing a ready color comparison for the deposited metal ion of the electrolyte printed ink 24 to determine the state-of-charge of the battery.

In FIG. 2, the cell tester 20 is shown mounted on a battery 39, only a portion of which is shown. In the example shown here, the cell tester 20 comprises a transparent or translucent plastic layer 21, electrode 25, an ionically conducting printed electrolyte ink 24, and an electrically conductive layer 26 positioned on plastic sheet 31. Conductive layer 26 can be part of the battery label or can be part of the battery housing. If it is part of the battery housing, then an electrical conductor, such as 27 or 29, would not be required since the conductive layer 26 would be part of the terminal of the battery being tested. Electrode 25 is printed on the transparent plastic sheet 21. In one embodiment, the tester device can be produced as a separate label stack or insert that can be assembled and then positioned appropriately on the battery as a separate insert.

Referring to FIG. 3, a typical C or D size dry cell battery is shown and indicated generally by the number 50. A typical battery has a cylindrical housing 51 and an end cover 53 in contact with positive terminal 55. The opposite end cover is indicated by 57. On the side of housing 51 is a cell label tester 60. The cell label tester can have one or more cells, for example three cells, similar to cell 20 of FIG. 1. Cell 64 can be poised to indicate a fresh battery. Cell 63 can be of a similar construction, however, having a different ionically conductive electrolyte printed ink and being poised to indicate a good condition of the battery, while cell 65 is again of similar construction with a different ionically conductive electrolyte printed ink which indicates that the battery should be replaced. Cell 65 is connected to the negative end cover 57 by means of a conductive strip of material 67 which is folded under and has a contact 69. At the opposite end of the cell label tester, a conductor 71 completes the connection to the positive terminal of the battery. Alternative means of making contact between the label tester cell or cells and the battery terminals may be used.

As shown in FIG. 3, the label cell tester is continuously in contact with the negative and positive external terminals of the battery. When used in such applications, it is preferred to use a solid state cell, the layers of which are printed on the surface of the transparent plastic sheet 21 shown in FIG. 1. It is preferred to use a suitable switch such as switch 35 (FIG. 1) to momentarily connect the cell tester label across the terminals of the battery and, after the reading is complete, the switch should be opened to electrically isolate the battery from the cell tester label.

As indicated above, the battery state indicating device can be in continuous electrical contact with the external terminals of the battery. Since the cell tester device does draw current, it is preferred to have some type of an external switch to isolate it from the battery. The cell tester device can be used in either an open circuit or a closed circuit mode. In the closed circuit mode, the voltage of the battery is tested under load. FIGS. 4 and 5 show a typical open circuit configuration for testing a battery. In FIG. 4, cell tester device 130 is connected in series with battery 131 to be tested. In FIG. 5, cell tester device 130 is again connected to battery 131; however, in this circuit a switch 133 is used to take the cell tester device out of the circuit so as not to discharge the battery. It can be seen in the open circuit test that no load other than the cell tester device itself is placed across the terminals of the battery being tested.

Referring to FIG. 6, this figure represents a typical closed circuit test in which a load resistor 135 is place across the cell tester device 130. The battery 131 is again connected for testing or isolated by a switch 133. In the open circuit measurement circuit, as shown in FIGS. 4 and 5, the test label cell should be poised to sense the range of voltage produced by the battery 131. When a different voltage range is produced by different types of batteries, different cell components can be used in the cell tester device. In the circuit of FIG. 6, the load resistor 135 can be varied to match the cell tester device 130 to the potential produced by the battery 131 in addition to selection of the appropriate components of the cell. The load resistor 135 can be formed using a indium-tin oxide printed electrode or a printed conductive layer having intermediate resistivity. Such a component can be shaped or patterned to vary the resistance and serve as the load along which the potential decreases.

Figure 8:
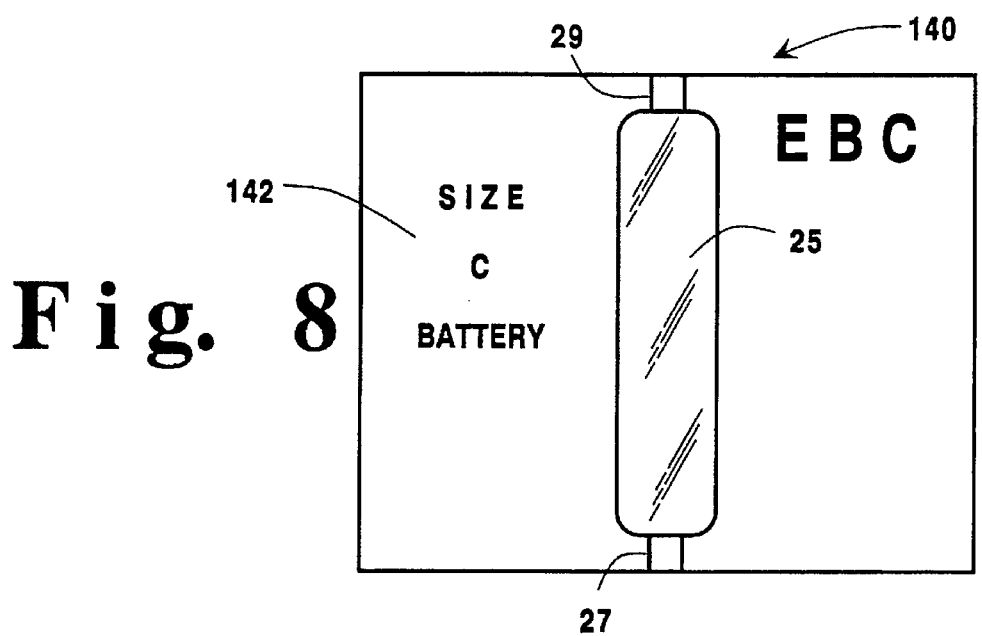
FIG. 8 is a partial elevational view of a label for a battery including a printed cell tester device of this invention.

FIGS. 7 and 8 show the several components of the cell tester applied as the label indicated generally by 140 using the same reference numbers for the same components shown in FIGS. 1 and 2. During the label printing process appropriate graphics 142 can be applied to the label. For example, the components of the cell tester is provided by printing the components in a preselected order on a label substrate using ink. The label tester can be prepared so that the working electrode is in electrical contact with one external terminal of the battery and the conductive layer is in electrical contact with the opposite terminal of the battery. Either electrical conductor 27 or 29, or both, can be printed on the label so that it terminates near one external terminal of the battery without making electrical contact. The open circuit can then be closed by bringing that electrical conductor on the label which is near one terminal of the battery into contact with that terminal to activate the tester. If desired, one conductor can be printed so that it will make electrical contact with a terminal of the battery when the label is applied.

The use of at least one switch is desired, preferably two switches, to reduce the chances of inadvertent activation of the tester. If desired, one of these end contacts could be made permanent by crimping the label edge over into intimate contact with that portion of the cell container. Another switch can be provided on the side of the cell if desired or on the opposite end of the cell.

Figure 9:
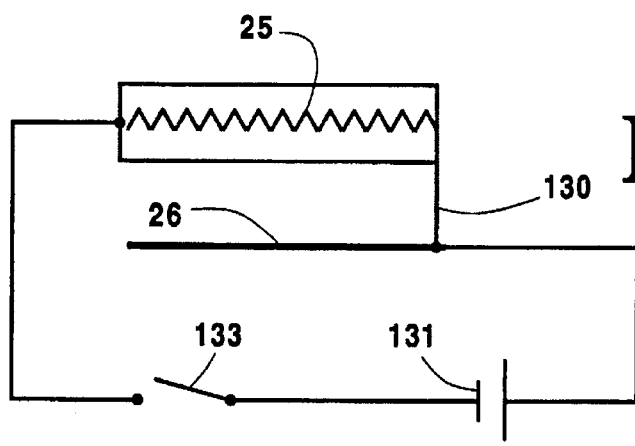
FIG. 9 is a schematic of an electrode arrangement shown connected by switch means to a cell to be tested.

The selection and matching of the voltage range of the cell tester device can thus be largely avoided by using a testing circuit such as that shown in FIG. 9 in which the resistivity of the electrode 25 provides the resistive load and, in combination with the cell 131, acts as a voltage divider. In this circuit, the voltage drop across the cell tester device 130 varies from the closed circuit voltage obtained at the left end of the electrode, as shown in FIG. 9, to a lower voltage (possibly zero volt) at the other end. With this type of indicator, the state-of-charge of the cell is determined by the position of the change of the visual appearance in the test cell device.

Figure 10:
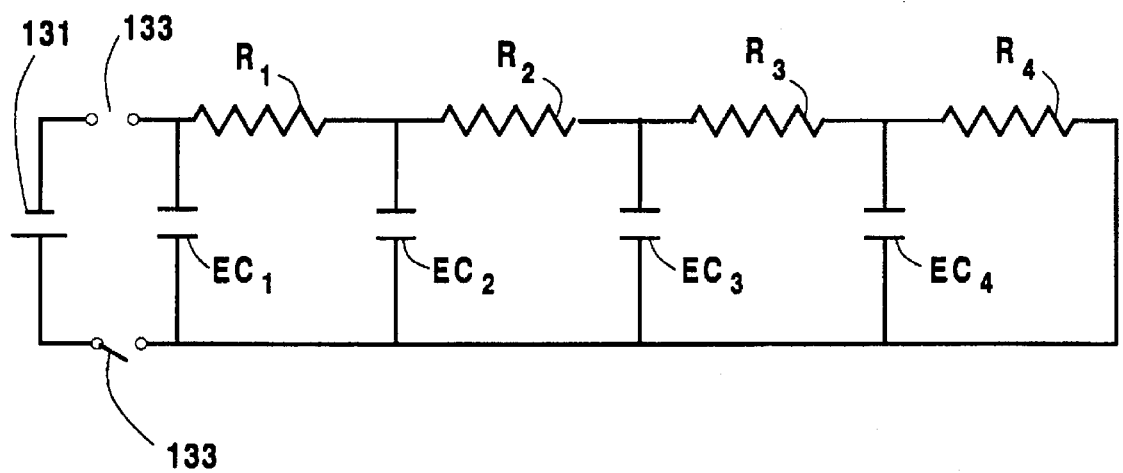
FIG. 10 is a schematic view of a cell tester circuit showing the use of several electrochromic devices arranged in parallel to set up a voltage divider network, thereby providing a scale means.

FIG. 10 is a schematic view of a cell tester circuit comprising a cell 131 to be tested, a switch 131 connected in parallel with electrochromic electrodes EC1, EC2, EC3 and EC4 and resistors R1, R2, R3 and R4 as shown. The full cell potential of cell 131 would be across EC1 and the potential of cell 131 would be reduced from RC2 to RC4. This type of circuit shows the use of several electrochromic devices arranged in parallel to set up a voltage divider network that is ideally suitable as scale means for the cell.

In the manufacture of the label tester, it is preferred to use a web of the substrate material which can hold many labels and run the web through suitable printing operations where the graphics for each painted label can be applied to the web along with each layer of the tester. After the label tester has been applied, the web of material can be run through a suitable punch or die cutting operation to separate the individual labels from the web so that the labels can be applied to batteries in the finishing of the battery during the heat shrinking of the label.

From the above description it can be seen that a cell testing label can be provided for testing the state of a battery which can be applied to the housing of the battery and left in place at all times. Since the device does not rely on heat, the thermal mass of the battery will not affect the operation of the device. When the electrical circuit for the testing device is completed, the deposited metal ions will change the visual appearance of the tester device so that such change will indicate the state of the cell.

Though the invention has been described with respect to a specific preferred embodiment thereof, many variations and modifications will become apparent to those skilled in the art.

What is claimed:

1. A cell tester device for an electrochemical cell having a first terminal and a second terminal of opposite polarity in which the cell tester device comprises a translucent plastic layer; a transparent electrically conductive electrode printed on the plastic layer and adapted to make electrical contact with the first terminal of the cell; an ionically conductive electrolyte layer disposed on the transparent electrically conductive electrode and said electrolyte containing at least one electrochromic material that undergoes a visible change in color as the result of a chemical reaction in response to an applied potential voltage; and a conductive layer disposed over the electrolyte and adapted to make contact with the second terminal of the cell so that when the conductive means of the transparent electrically conductive electrode makes electrical contact with the first terminal of the cell and the conductive layer makes electrical contact with the second terminal of the cell, the electrochromic material will undergo a visible change that can be seen through the transparent electrically conductive electrode.

2. The cell tester device of claim 1 wherein the electrolyte layer is a printed electrolyte layer.

3. The cell tester device of claim 1 wherein the conductive layer is a printed conductive layer.

4. The cell tester device of claim 3 wherein the electrolyte layer is a printed electrolyte layer.

5. The cell tester device of claim 4 wherein the transparent electrically conductive printed electrode is between 0.1 to 20 microns thick.

6. The cell tester device of claim 5 wherein the electrolyte printed layer is between 1 to 200 microns thick.

7. The cell tester device of claim 6 wherein the conductive printed layer is between 2 to 200 microns thick.

8. The cell tester device of claim 1 wherein the transparent electrically conductive electrode is an indium-tin oxide material.

9. The cell tester device of claim 1 where conductive means is provided as a second conductive layer in contact with the transparent electrically conductive electrode.

10. The cell tester device of claim 9 wherein the second conductive layer is selected from the group consisting of carbon, silver, nickel, titanium and electrically conductive polymers.

11. The cell tester device of claim 1 wherein the electrolyte comprises hydroxyethyl cellulose, hydroxypropyl cellulose, polyvinylalcohol or PEO; a $TiO_2$ pigment, and a bismuth, copper or bromine salt or combinations of salts.

12. The cell tester device of claim 1 wherein the electrolyte contains a binder and a color pigment.

13. The cell tester device of claim 12 wherein the color pigment in the electrolyte $TiO_2$ pigment.

14. The cell tester device of claim 1 wherein the transparent electrically conductive electrode comprises indium-tin oxide.

15. The cell tester device of claim 4 wherein the transparent electrically conductive printed electrode is from 0.1 to 20 microns thick, the conductive printed layer is from 2 to 200 microns thick and the ionically conductive printed electrolyte is from 1 to 200 microns thick.

16. A method of producing a printed cell tester device comprising the steps:

(a) printing a transparent electrically conductive electrode ink with conductive means on a transparent plastic film;

(b) printing an ionically conductive electrolyte ink on the printed transparent electrically conductive electrode; and (c) printing a conductive ink on the printed ionically conductive electrolyte.

17. The method of claim 16 wherein after step (c) assembling the printed components onto an electrochemical cell.

18. The method of claim 17 wherein the printed transparent electrically conductive electrode is between 0.1 to 20 microns thick, the printed ionically conductive electrolyte is between 1 to 200 microns thick, and the printed conductive layer is between 2 to 200 microns thick.

19. The method of claim 18 wherein the transparent electrically conductive electrode comprises indium-tin oxide.

20. The method of claim 18 wherein the printed transparent electrically conductive electrode, the printed electrolyte ink and printed conductive ink is between 20 and 800 microns thick.

* * * * *